(12) United States Patent
Liu et al.

(10) Patent No.: US 10,990,206 B2
(45) Date of Patent: Apr. 27, 2021

(54) DISPLAY PANEL AND TOUCH DISPLAY DEVICE

(71) Applicant: SHANGHAI TIANMA MICRO-ELECTRONICS CO., LTD., Shanghai (CN)

(72) Inventors: Liang Liu, Shanghai (CN); Qijun Yao, Shanghai (CN); Xingyao Zhou, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 149 days.

(21) Appl. No.: 15/717,877

(22) Filed: Sep. 27, 2017

(65) Prior Publication Data
US 2018/0039362 A1     Feb. 8, 2018

(30) Foreign Application Priority Data

Jun. 30, 2017 (CN) .......................... 2017 1 0523302

(51) Int. Cl.
| | |
|---|---|
| *G06F 3/041* | (2006.01) |
| *G02F 1/1333* | (2006.01) |
| *G02F 1/1339* | (2006.01) |
| *G06F 3/045* | (2006.01) |
| *H01L 27/32* | (2006.01) |
| *H01L 51/52* | (2006.01) |

(52) U.S. Cl.
CPC .......... *G06F 3/0412* (2013.01); *G02F 1/1339* (2013.01); *G02F 1/13338* (2013.01); *G06F 3/045* (2013.01); *G06F 3/04142* (2019.05); *G06F 3/04164* (2019.05); *H01L 27/323* (2013.01); *H01L 27/3225* (2013.01); *H01L 51/5246* (2013.01); *G06F 2203/04102* (2013.01); *H01L 27/3244* (2013.01)

(58) Field of Classification Search
None
See application file for complete search history.

(56) References Cited

U.S. PATENT DOCUMENTS

| 9,690,413 B2* | 6/2017 | Filiz ..................... G01L 1/005 |
| 2010/0220065 A1* | 9/2010 | Ma ........................ G06F 3/016 |
| | | 345/173 |

(Continued)

FOREIGN PATENT DOCUMENTS

| CN | 106020563 A | 10/2016 |
| CN | 106486463 A | 3/2017 |

*Primary Examiner* — Andre L Matthews
(74) *Attorney, Agent, or Firm* — Kilpatrick Townsend & Stockton, LLP

(57) ABSTRACT

Disclosed are a display panel and a touch display device. The display panel comprises: a first substrate and a second substrate provided opposite to each other, which are adhered to each other via a sealant; a plurality of pressure sensors, which are provided on one side of the first substrate facing the second substrate or on one side of the second substrate facing the first substrate, wherein, the pressure sensor comprises plurality of resistors, and a projection of the sealant in a direction vertical to the display panel covers at least one resistor in the pressure sensor. In the embodiments of the disclosure, the projection of the sealant adhering the first substrate to the second substrate in the direction vertical to the display panel covers at least one resistor in the pressure sensor.

16 Claims, 25 Drawing Sheets

(56) References Cited

U.S. PATENT DOCUMENTS

2018/0196569 A1* 7/2018 Jun .................. G06F 3/044
2019/0049326 A1* 2/2019 Li ................... G01L 9/0054
2019/0171334 A1* 6/2019 Wang ............... G06F 3/0416

* cited by examiner

DISPLAY PANEL AND TOUCH DISPLAY DEVICE

CROSS-REFERENCE TO RELATED APPLICATIONS

This application claims priority to Chinese Patent Application No. 201710523302.0, filed on Jun. 30, 2017 and entitled "DISPLAY PANEL AND TOUCH DISPLAY DEVICE", the disclosure of which is incorporated herein by reference in its entirety.

TECHNICAL FIELD

The present disclosure relates to display technologies, and in particular, to a display panel and a touch display device.

BACKGROUND

With the rapid development of the technologies of portable electronic terminal devices such as mobile phones and pads, more and more novel technologies are applied to these electronic terminal devices. Currently, pressure-sensitive touch technology is one of the novel technologies which may cause concern in the field. Touch screens integrated with the pressure-sensitive touch screen technology may clearly distinguish between a touch action and a press action. When a user presses a screen, the touch screen integrated with a pressure sensor can exactly identify the pressure transferred by the user on the touch surface, thereby realizing different operations, for example, calling more control options in applications such as Message, Music and Calendar, etc.

The existing pressure sensor is generally integrated on the periphery of a display to detect whether the display is pressed and to detect the magnitude of the pressure, and hence a wide frame may be caused.

SUMMARY

The present disclosure provides a display panel and a touch display device to realize narrow frame.

In a first aspect, embodiments of the application provide a display panel, which includes: a first substrate and a second substrate provided opposite to each other, which are adhered to each other via a sealant; and a plurality of pressure sensors, which are provided on one side of the first substrate facing the second substrate or on one side of the second substrate facing the first substrate, wherein, the pressure sensor comprises a plurality of resistors, and a projection of the sealant in a direction vertical to the display panel covers at least one resistor of the plurality of resistors in the pressure sensor.

In a second aspect, embodiments of the disclosure further provide a touch display device, which includes the above display panel.

In the embodiments of the disclosure, the projection of the sealant adhering the first substrate to the second substrate in a direction vertical to the display panel covers at least one resistor in the pressure sensor, so that the occupied area of the frame region can be reduced, thereby realizing a narrow frame; on the other hand, a projection of the sealant in a direction vertical to the display panel covers at least one resistor in the pressure sensor, so that the resistance change of the resistor covered by the sealant in the pressure sensor after being pressed is much less than the resistance change of the resistor uncovered by the sealant in the pressure sensor, thereby increasing the difference between the resistance values of the plurality of resistors in the pressure sensor, facilitating the unbalance of the Wheatstone bridge structure, and hence improving the precision of pressure-sensitive detection of the display panel.

BRIEF DESCRIPTION OF THE DRAWINGS

Drawings needed in the embodiments of the disclosure will be introduced briefly below for more clearly illustrating the technical solutions of the exemplary embodiments of the disclosure. It will be apparent that, the drawings merely illustrate exemplary embodiments of the disclosure. Those skilled in the art can conceive other drawings from the illustrated drawings without inventive efforts.

DETAILED DESCRIPTION

The application will be illustrated in detail in conjunction with the drawings and embodiments. It may be understood that, the embodiments described here are only set for explaining, rather than limiting, the application. Additionally, it further needs to be noted that, for convenient description, the drawings only show the parts related to the application, rather than the whole structure.

Figure 1:
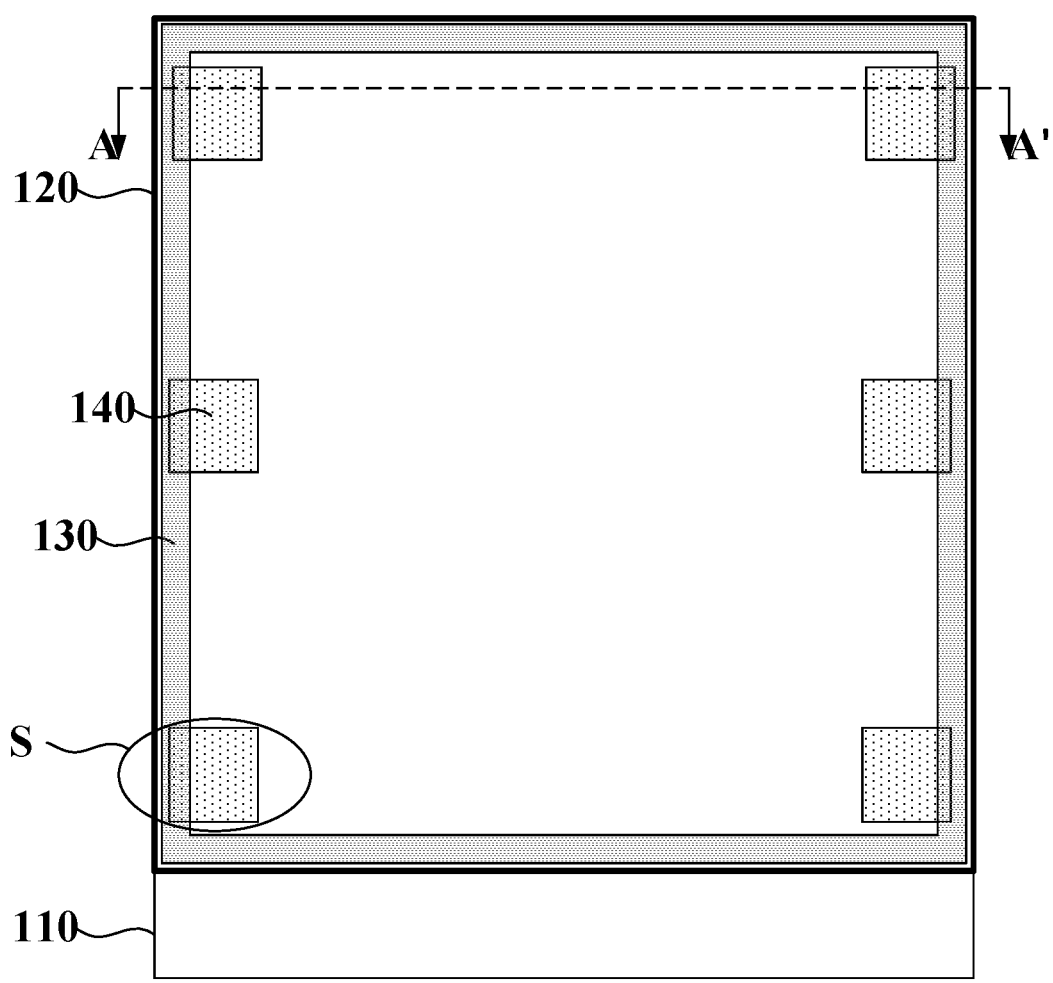
FIG. 1A is a schematic diagram of a display panel according to an embodiment of the disclosure.
FIG. 1B is a sectional view of FIG. 1A along A-A'.
FIG. 1C is an enlarged view of region S of FIG. 1A.
Figure 1A:
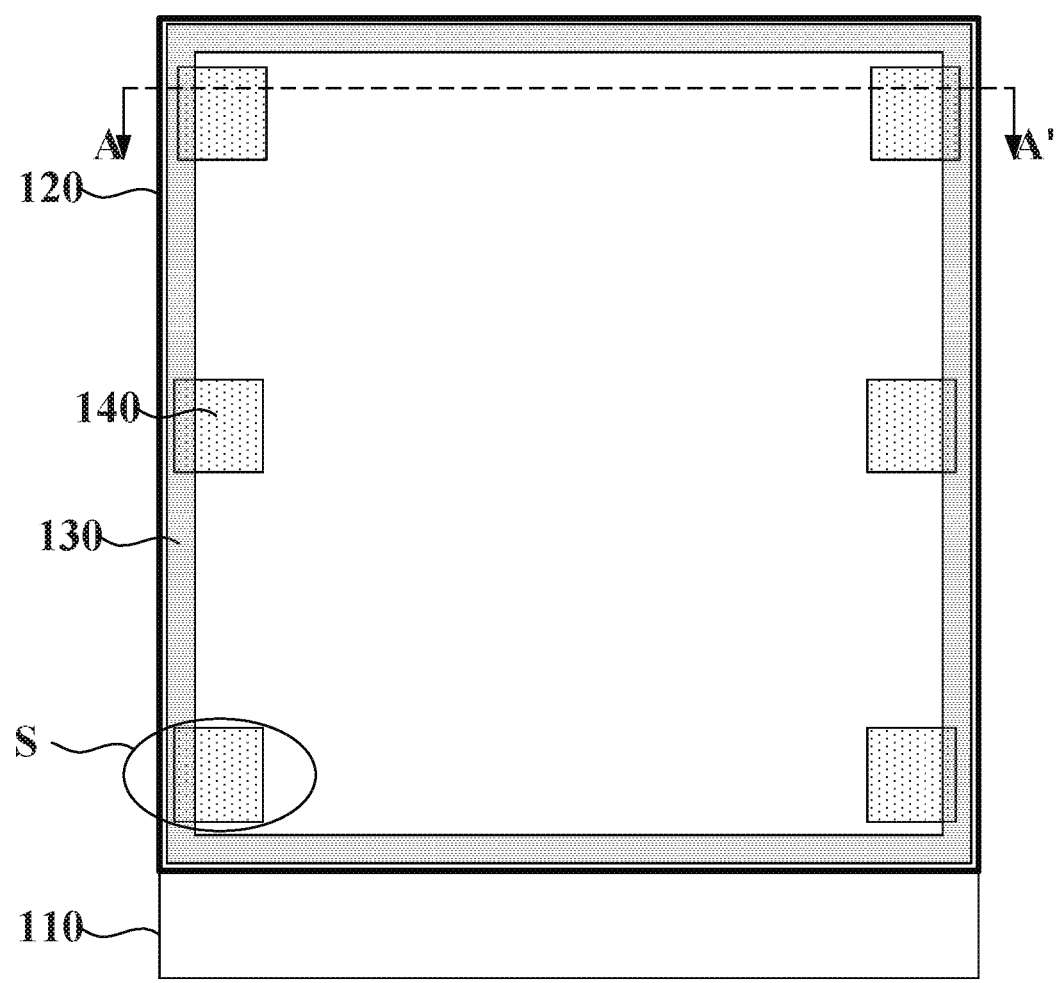
Figure 1B:
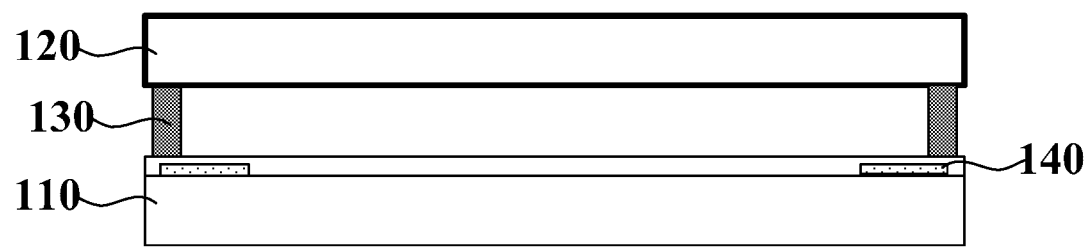
Figure 1C:
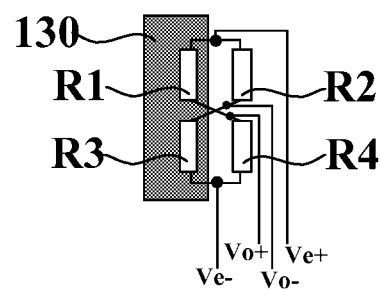

Referring to FIG. 1A and FIG. 1B, FIG. 1B is a sectional view of FIG. 1A along A-A', and FIG. 1C is an enlarged view of region S of FIG. 1A. In the embodiment of the disclosure, the display panel includes: a first substrate 110 and a second substrate 120 provided opposite to each other, which are adhered to each other via a sealant 130; a plurality of pressure sensors 140, which are provided on one side of the first substrate 110 facing the second substrate 120, wherein, the pressure sensor 140 includes four resistors, and the projection of the sealant 130 in the direction vertical to the display panel covers at least one resistor of the four resistors in the pressure sensor 140.

In the embodiment of the disclosure, the pressure sensor 140 includes four resistors. In one embodiment, the pressure sensor 140 includes: a first resistor R1, a second resistor R2, a third resistor R3 and a fourth resistor R4 that are electrically connected successively end to end, the electrical connection point of the first resistor R1 and the fourth resistor R4 functions as a first power input terminal Vo+, the electrical connection point of the second resistor R2 and the third resistor R3 functions as a second power input terminal Vo−, the electrical connection point of the first resistor R1 and the second resistor R2 functions as a first induction signal-measuring terminal Ve+, and the electrical connection point of the third resistor R3 and the fourth resistor R4 functions as a second induction signal-measuring terminal Ve−. The display panel is configured to detect a voltage signal between the first induction signal-measuring terminal Ve+ and the second induction signal-measuring terminal Ve− to determine whether it is pressed and to determine the pressed state.

The four resistors of the pressure sensor 140 form a Wheatstone bridge structure. When the Wheatstone bridge is kept balanced, R1/R2=R4/R3; also, when the Wheatstone bridge is unbalanced, R1/R2≠R4/R3.

In the embodiment of the disclosure, if no pressure is applied to the display panel, the resistance value of the four resistors of the pressure sensor 140 will not be changed, that is, the Wheatstone bridge structure formed by the four resistors of the pressure sensor 140 is kept balanced, and the pressure-sensitive detection signal output by the induction signal-measuring terminals (Ve+, Ve−) of the pressure sensor 140 is 0V. If there is a press action on the display panel, the pressure sensor 140 will be deformed under the pressure, then the resistance value of the four resistors of the pressure sensor 140 will be changed correspondingly according to the magnitude of the pressure, so that the balance of the Wheatstone bridge structure formed by the four resistors of the pressure sensor 140 will be broken, and the pressure sensor 140 generates a pressure-sensitive detection signal according to the sensed magnitude of the pressure, wherein the pressure-sensitive detection signal is not 0V.

In the embodiment of the disclosure, the pressure-sensitive detection process of the display panel is as follows: in the pressure-sensitive detection stage, the display panel applies the same pressure-sensitive drive signal to each of the pressure sensors 140; the display panel acquires the pressure-sensitive detection signal from each of the pressure sensors 140 via the induction signal-measuring terminals (Ve+, Ve−) of the pressure sensor 140; and the display panel determines whether there is a press action, the pressed location and the magnitude of the pressure according to the magnitude of the pressure-sensitive detection signal from each of the pressure sensors 140, and performs the corresponding operation.

In the embodiment of the disclosure, the first substrate 110 and the second substrate 120 are adhered to each other via the sealant 130. Specifically, the sealant 130 surrounds the display region of the display panel and adheres the first substrate 110 to the second substrate 120. The projection of the sealant 130 in the direction vertical to the display panel covers at least one resistor in the pressure sensor 140, that is, the pressure sensor 140 overlaps with the sealant 130 in the direction vertical to the display panel, so that the area of the frame region occupied can be reduced, and narrow frame can be realized.

In the embodiment of the disclosure, the sealant 130 adheres the first substrate 110 to the second substrate 120 and surrounds the display region of the display panel. Based on the transitivity of force, the sealant 130 between the first substrate 110 and the second substrate 120 can have a function of force transmission, thereby having a supporting function. When a user presses the display panel, based on the support function of the sealant 130, the strain in the sealant region corresponding to the sealant 130 of the display panel is relatively small, but the strain in the sealant inner-side region defined by the sealant 130 of the display panel is relatively large, which may be illustrated by FIG. 2A and FIG. 2B herein.

Figure 2A:
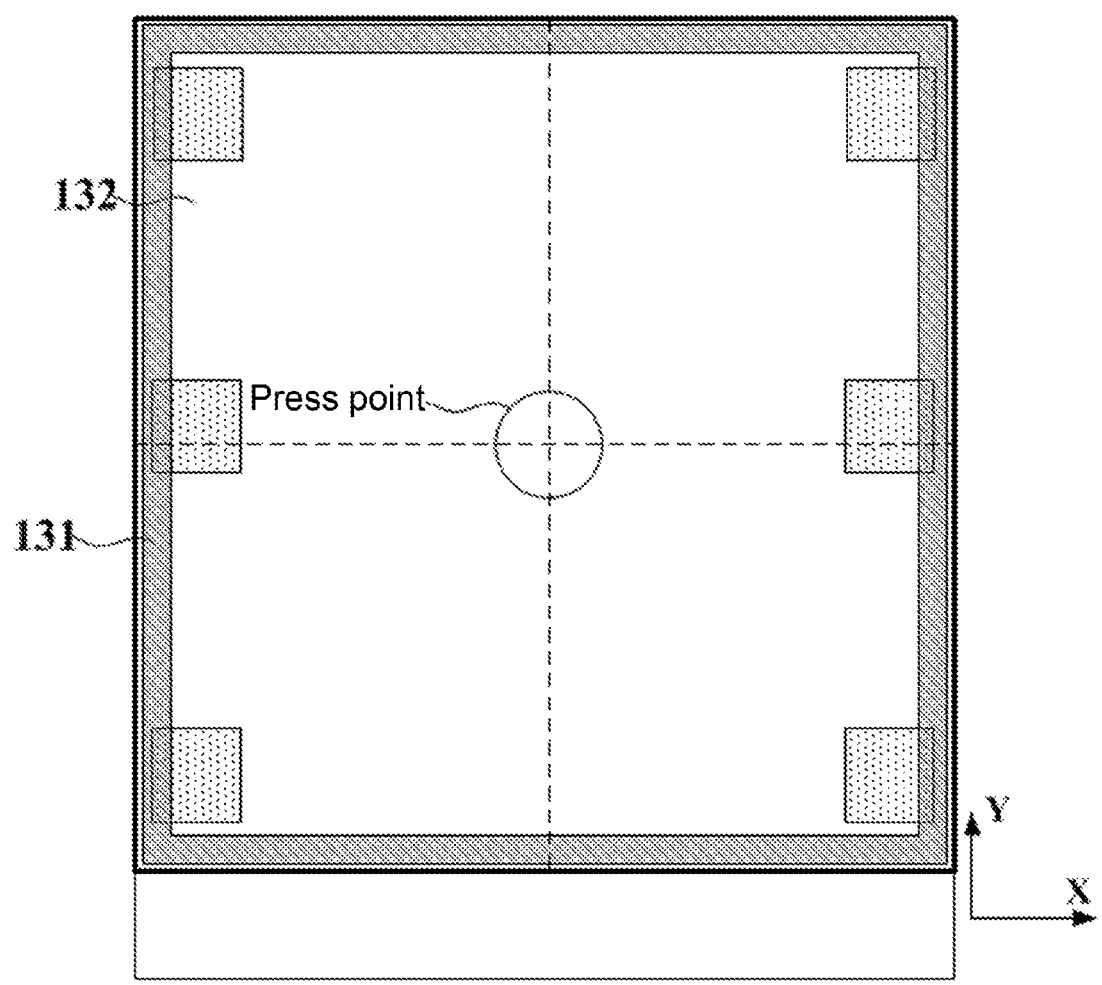
FIG. 2A is a schematic diagram showing a press action.
Figure 2B:
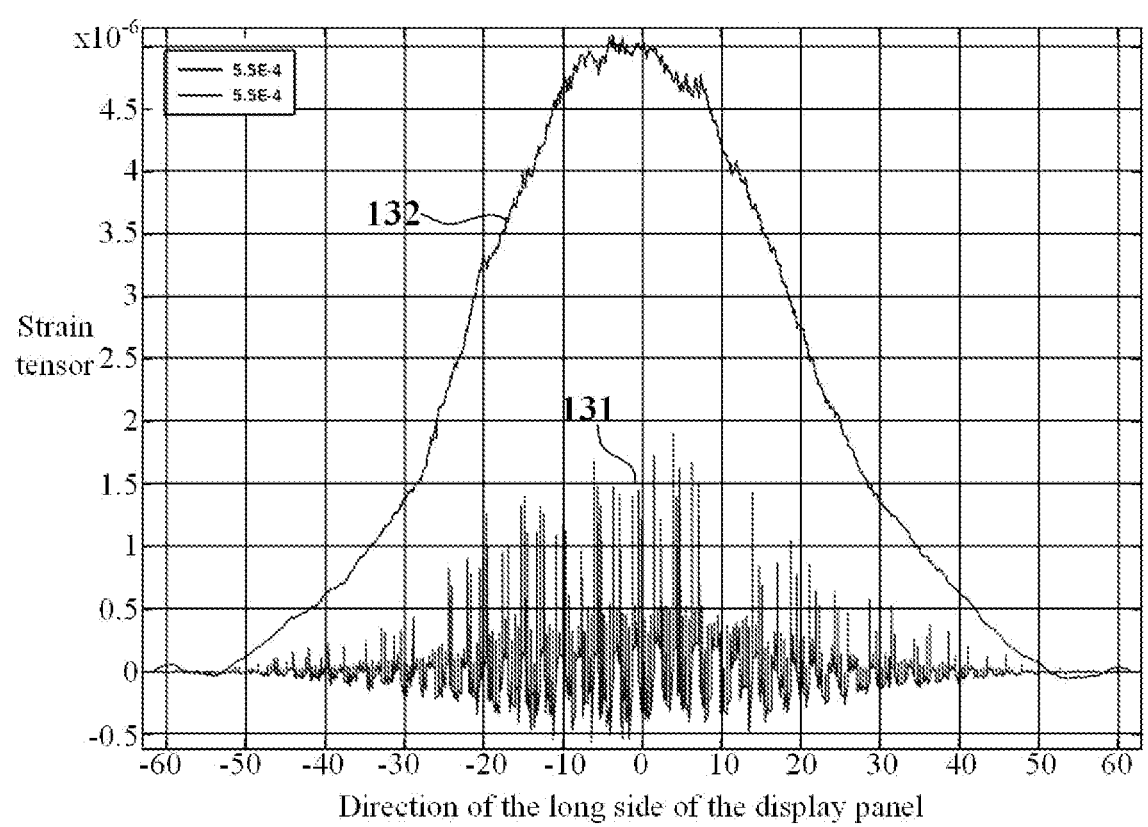
FIG. 2B is a schematic diagram showing the strain of FIG. 2A.

Referring to FIG. 2A, a user presses on the center region of the display panel, and the display panel is deformed. FIG. 2B is a schematic diagram showing the strain of FIG. 2A, and it shows the distribution of the normal strain of the sealant region 131 and the normal strain of the sealant inner-side region 132 along the long side of the display panel (Y direction), wherein, the horizontal coordinate represents the direction of the long side of the display panel, and the longitudinal coordinate represents the magnitude of the strain tensor of the normal strain distributed along the direction of the long side of the display panel. The strain tensor is a mathematical representation of the strain state (i.e., the magnitude of strain). The larger the strain state is, the larger the strain tensor will be, and the smaller the strain state is, the smaller the strain tensor will be. As shown in FIG. 2A and FIG. 2B, when a user presses on the center region of the display panel, the maximum value of the normal strain tensor of the sealant region 131 does not exceed $2*10^{-6}$, and the maximum value of the normal strain tensor of the sealant inner-side region 132 exceeds $5*10^{-6}$. The normal strain of the sealant region 131 is much less than the normal strain of the sealant inner-side region 132. That is, the deformation of the sealant region 131 is much less than the deformation of the sealant inner-side region 132.

Based on the arrangement that the deformation of the sealant region 131 is much less than the deformation of the sealant inner-side region 132 when a user presses on the display panel, and the projection of the sealant 130 in the direction vertical to the display panel will cover at least one resistor in the pressure sensor 140, the deformation of the resistor covered by the sealant 130 in the pressure sensor 140 after being pressed by the user will be much less than the deformation of the resistor uncovered by the sealant 130 in the pressure sensor 140. That is, the resistance change of the resistor covered by the sealant 130 in the pressure sensor 140 will be much less than the resistance change of the resistor uncovered by the sealant 130 in the pressure sensor 140. Thus, the resistance change difference between the four resistors in the pressure sensor 140 may be increased, thereby facilitating the unbalance of the Wheatstone bridge structure, and improving the precision of pressure-sensitive detection of the display panel.

In the embodiment of the disclosure, the display panel is a liquid crystal display panel. In this case, the first substrate 110 is an array substrate, the second substrate 120 is a color filter substrate, a liquid crystal layer is provided between the first substrate 110 and the second substrate 120, and the first substrate 110 and the second substrate 120 are adhered to each other via the sealant 130 to prevent the liquid crystal from flowing out. It may be understood by one skilled in the art that, the manufacture process, the material and the film structure, etc., of the first substrate, the second substrate and the sealant in the liquid crystal the display panel in the embodiments of the disclosure are similar to those of the prior art, and the operating principle of the liquid crystal display panel is similar to that of the prior art, thus no repeated description will be given here.

In the embodiment of the disclosure, further the display panel is an organic light-emitting display panel. In this case, the first substrate 110 is an organic light-emitting display array substrate, the second substrate 120 is an encapsulation glass, and the sealant 130 adhering the first substrate 110 to the second substrate 120 may optionally be made of glass powder. It may be understood by one skilled in the art that, the manufacture process, the material and the film structure, etc., of the first substrate, the second substrate and the sealant in the embodiment of the disclosure are similar to those of the prior art, and the operating principle of the organic light-emitting display panel is similar to that of the prior art, thus no repeated description will be given herein.

Figure 3:
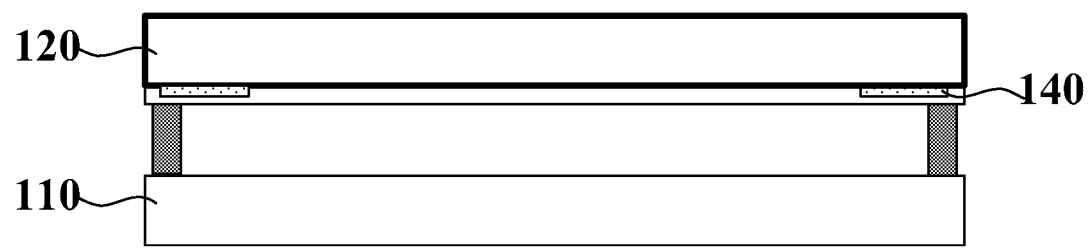
FIG. 3 is a schematic diagram of a display panel according to an embodiment of the disclosure.

Referring to FIG. 3, the difference from the above examples only lies in that, a plurality of pressure sensors 140 are provided on one side of the second substrate 120 facing the first substrate 110.

In one embodiment, in the embodiment of the disclosure, the projection of the sealant 130 in the direction vertical to the display panel covers at most three resistors in the pressure sensor 140. The pressure sensor 140 includes four resistors. If the projection of the sealant 130 in the direction vertical to the display panel covers four resistors of the pressure sensor 140, based on the arrangement that the deformation of the sealant region 131 is much less than the deformation of the sealant inner-side region 132 when the display panel is pressed, the resistance change of each of the four resistors in the pressure sensor 140 after being pressed by the user is very small, and it is difficult to exactly detect whether it is pressed or detect the press degree. When the projection of the sealant 130 in the direction vertical to the display panel covers at least one resistor in the pressure sensor 140 and the projection of the sealant 130 in the direction vertical to the display panel covers at most three resistors in the pressure sensor 140, the resistance change of the resistor covered by the sealant 130 in the pressure sensor 140 is much less than the resistance change of the resistor uncovered by the sealant 130 in the pressure sensor 140 when the display panel is pressed, so that the resistance change difference between the four resistors in the pressure sensor 140 may be increased, thereby facilitating the unbalance of the Wheatstone bridge structure, and improving the precision of pressure-sensitive detection of the display panel.

In the embodiment of the disclosure, the projection of the sealant adhering the first substrate to the second substrate in a direction vertical to the display panel covers at least one resistor in the pressure sensor, so that the area of the occupied frame region can be reduced, thereby realizing narrow frame; on the other hand, the projection of the sealant in a direction vertical to the display panel covers at least one resistor in the pressure sensor, so that the resistance change of the resistor covered by the sealant in the pressure sensor after being pressed is much less than the resistance change of the resistor uncovered by the sealant in the pressure sensor, thereby increasing the difference between the resistance values of the four resistors in the pressure sensor, facilitating the unbalance of the Wheatstone bridge structure, and improving the precision of pressure-sensitive detection of the display panel.

Figure 4A:
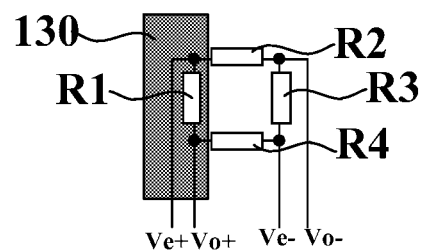
FIG. 4A-FIG. 4D are schematic diagrams of a display panel according to an embodiment of the disclosure.

In one embodiment, referring to FIG. 4A, in the embodiment of the disclosure, the projection of the sealant 130 in the direction vertical to the display panel covers one resistor (for example, R1) in the pressure sensor 140. When the Wheatstone bridge is kept balanced, R1/R2=R4/R3. As shown in FIG. 4A, when the display panel is pressed, the resistance change of R1 is very small, and the resistance change of R2, R3 and R4 is large, thereby increasing the difference between R1/R2 and R4/R3, facilitating the unbalance of the Wheatstone bridge, and exactly determining whether it is pressed and also the press degree by acquiring the pressure-sensitive detection signal of the pressure sensor 140.

Figure 4B:
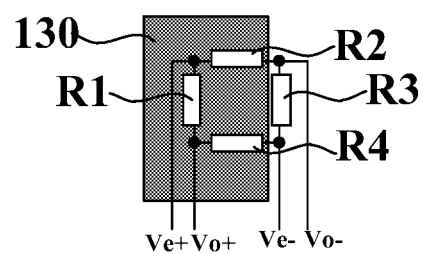

In one embodiment, referring to FIG. 4B, in the embodiment of the disclosure, the projection of the sealant 130 in the direction vertical to the display panel covers three resistors (for example, R1, R2 and R4) in the pressure sensor 140. When the Wheatstone bridge is kept balanced, R1/R2=R4/R3. As shown in FIG. 4B, when the display panel is pressed, the resistance change of R1, R2 and R4 is very small, the resistance change of R3 is large, thus the difference between R1/R2 and R4/R3 is increased, thereby facilitating the unbalance of the Wheatstone bridge, and exactly determining whether it is pressed and also the press degree by acquiring the pressure-sensitive detection signal of the pressure sensor 140.

Figure 4C:
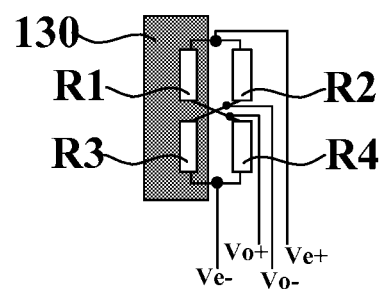
Figure 4D:
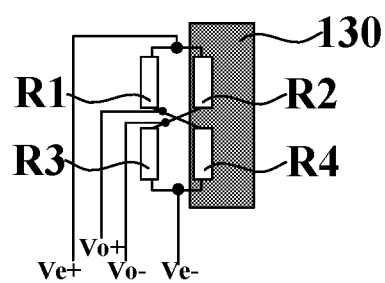

In one embodiment, referring to FIG. 4C and FIG. 4D, in the embodiment of the disclosure, the projection of the sealant 130 in the direction vertical to the display panel covers two resistors in the pressure sensor 140. In one embodiment, the two resistors covered are provided opposite to each other in the Wheatstone bridge structure.

Specifically, referring to FIG. 4C, in the embodiment of the disclosure, the projection of the sealant 130 in the direction vertical to the display panel covers the first resistor R1 and the third resistor R3 in the pressure sensor 140. When the Wheatstone bridge is kept balanced, R1/R2=R4/R3. As shown in FIG. 4C, when the display panel is pressed, the resistance change of R1 and R3 is very small, and the resistance change of R2 and R4 are large, and thus the difference between R1/R2 and R4/R3 is increased, thereby facilitating the unbalance of the Wheatstone bridge, and exactly determining whether it is pressed and also the press degree by acquiring the pressure-sensitive detection signal of the pressure sensor 140.

Specifically, referring to FIG. 4D, in the embodiment of the disclosure, the projection of the sealant 130 in the direction vertical to the display panel covers the second resistor R2 and the fourth resistor R4 in the pressure sensor 140. When the Wheatstone bridge is kept balanced, R1/R2=R4/R3. As shown in FIG. 4D, when the display panel is pressed, the resistance change of R2 and R4 is very small, the resistance change of R1 and R3 is large, and thus the difference between R1/R2 and R4/R3 is increased, thereby facilitating the unbalance of the Wheatstone bridge, and exactly determining whether it is pressed and also the press degree by acquiring the pressure-sensitive detection signal of the pressure sensor 140.

In the embodiment of the disclosure, the projection of the sealant 130 in the direction vertical to the display panel covers at least one resistor in the pressure sensor 140, and the projection of the sealant 130 in the direction vertical to the display panel covers at most three resistors in the pressure sensor 140. Thus, when the display panel is pressed, the resistance change of the resistor covered by the sealant 130 in the pressure sensor 140 is much less than the resistance change of the resistor uncovered by the sealant 130 in the pressure sensor 140, and hence the resistance change difference between the four resistors in the pressure sensor 140 may be increased, thereby facilitating the unbalance of the Wheatstone bridge structure, and hence improving the precision of pressure-sensitive detection of the display panel.

In one embodiment, in the embodiment of the disclosure, any resistor in the pressure sensor is a semiconductor material film. The pressure sensor may optionally employ a variable resistor made of a semiconductor material, and the semiconductor pressure sensor made of a semiconductor material has an advantage of high sensitivity and the strong pressure sensing ability, and also can effectively detect whether the display panel is pressed and detect the press degree thereof. On the other hand, the area of the semiconductor pressure sensor made of a semiconductor material is small, so that a semiconductor pressure sensor may be selected in consideration of narrow frame. When the semiconductor pressure sensor is provided on the left and right frames (the long sides of the frame) of the display panel, a shift register (VSR) for outputting a scanning signal to the scanning line is generally provided on the left and right frames, so that the semiconductor pressure sensor may be provided between the VSRs, that is, there would be a clear position between two adjacent VSRs to provide the semiconductor pressure sensor.

In the embodiment of the disclosure, the compositional material of the semiconductor material film forming the resistor in the pressure sensor may be amorphous silicon a-Si or polysilicon poly-Si. It may be understood by one skilled in the art that, the structure and the operating principle of the semiconductor pressure sensor are similar to those of the prior art, thus no repeated description will be given herein.

Figure 5:
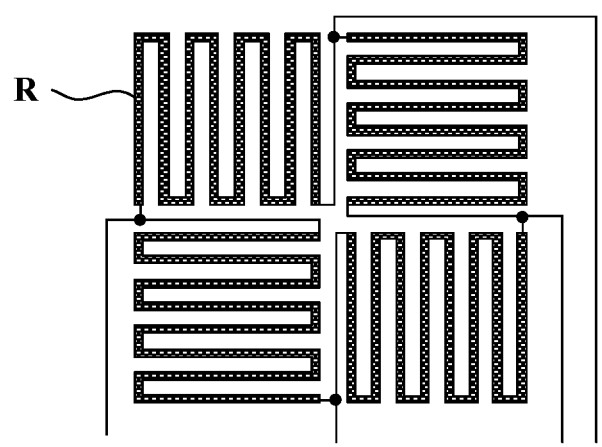
FIG. 5 is a schematic diagram of a pressure sensor according to an embodiment of the disclosure.

In one embodiment, referring to FIG. 5, in the embodiment of the disclosure, any resistor R in the pressure sensor 140 is in the form of a serpentine metal film wiring. The pressure sensor 140 may optionally be a variable resistor R made of a metal film material, and the pressure sensor 140 that employs a variable resistor R made of a metal film material is a metal bridge-type pressure sensor. The four resistors R of the metal bridge-type pressure sensor in which the resistors R is in the form of a serpentine metal film wiring is concentrated, and the advantage thereof lies in that: the temperature affection on each resistors R is uniform when temperature change occurs locally, so that the affection due to the temperature effect may be eliminated to a certain degree, and Wheatstone bridge unbalance due to temperature difference will not occur on each of the resistors R. In the embodiment of the disclosure, the metal film material forming the resistor in the pressure sensor may be ITO. It may be understood by one skilled in the art that, the structure and operating principle of the metal bridge-type pressure sensor are similar to those of the prior art, thus no repeated description will be given herein.

Figure 6A:
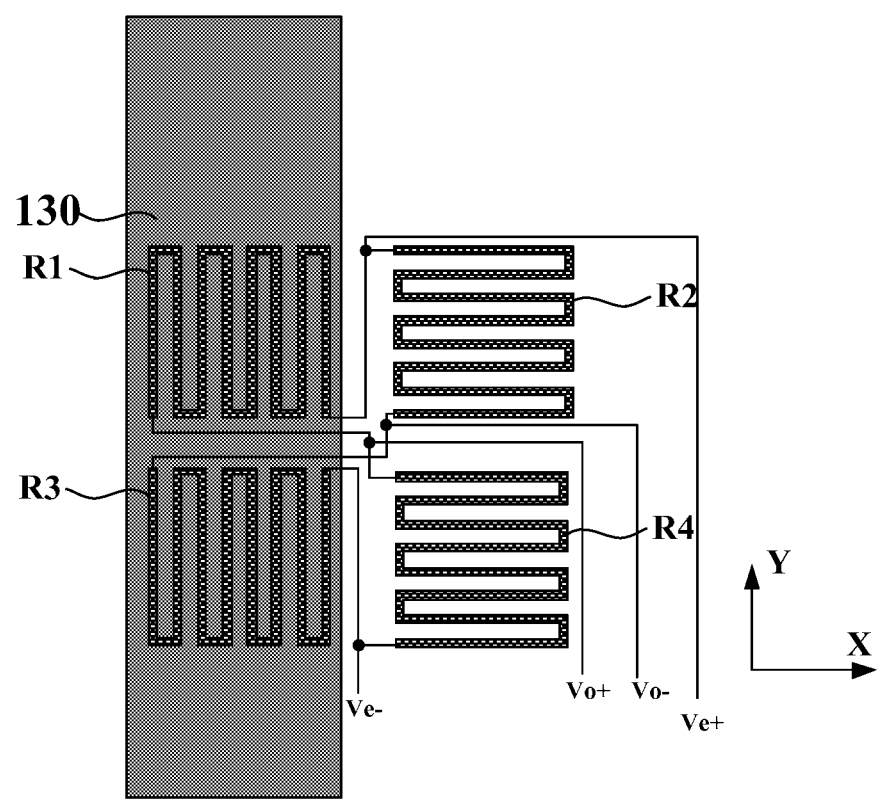
FIG. 6A-FIG. 6B are schematic diagrams of a display panel according to an embodiment of the disclosure.
Figure 6B:
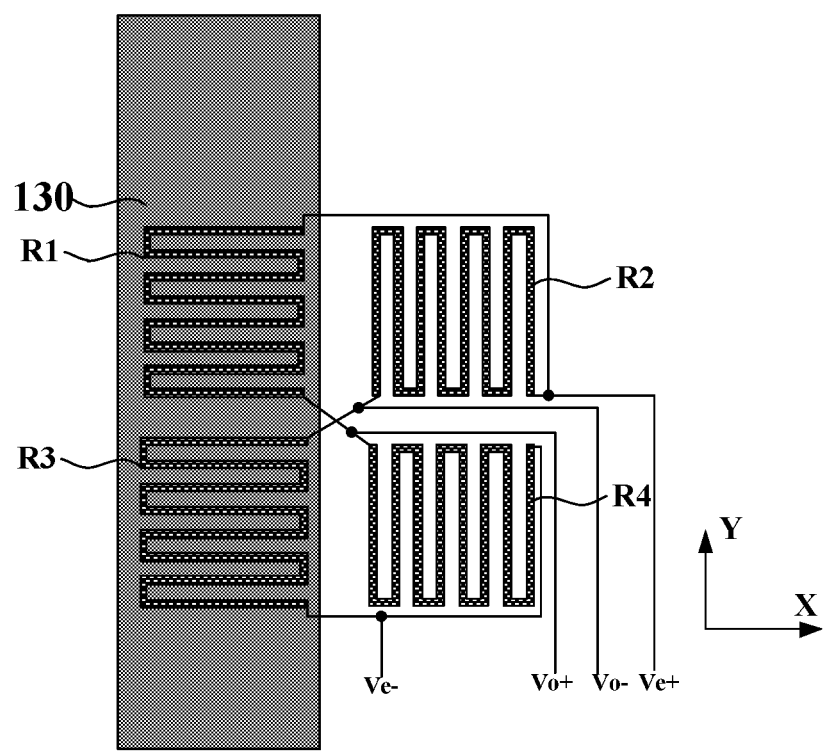

In one embodiment, on the basis of FIG. 5, referring to FIG. 6A, in an embodiment of the disclosure, the first resistor R1 and the third resistor R3 of the pressure sensor 140 extend along a first direction Y, the second resistor R2 and the fourth resistor R4 extend along a second direction X, wherein, the first direction Y and the second direction X are intersected with each other vertically, and the extension direction of the region of the sealant 130 covering the pressure sensor 140 is parallel to the first direction Y. The difference between FIG. 6B and FIG. 6A lies in that, the first resistor R1 and the third resistor R3 of the pressure sensor 140 extend along the first direction X, and the second resistor R2 and the fourth resistor R4 extend along the second direction Y, wherein, the first direction X and the second direction Y are intersected with each other vertically, and the extension direction of the region of the sealant 130 covering the pressure sensor 140 is vertical to the first direction X.

Figure 7A:
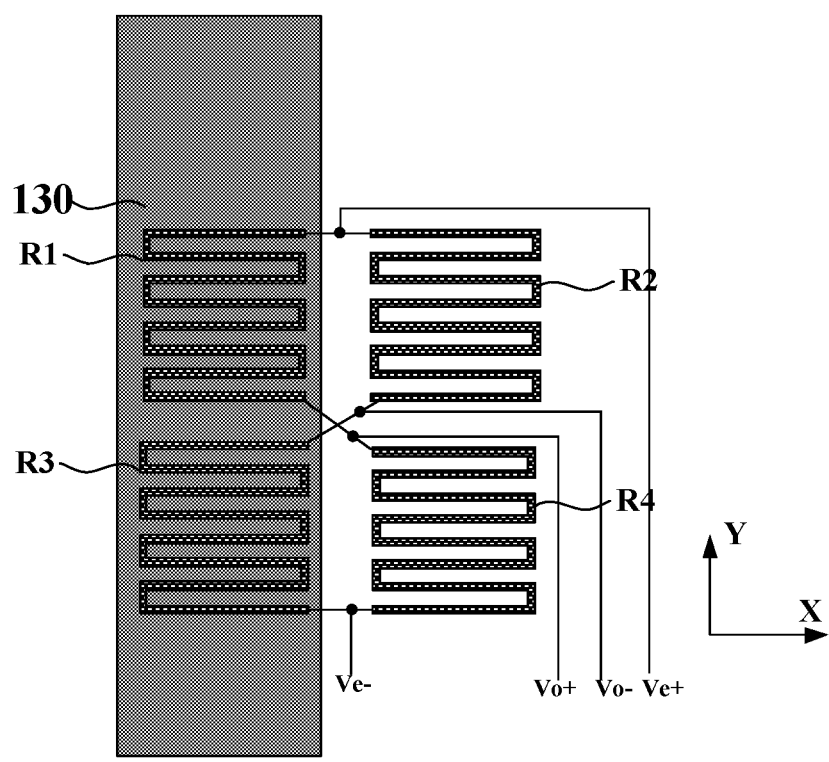
FIG. 7A-FIG. 7B are a schematic diagram of a display panel according to an embodiment of the disclosure.
Figure 7B:
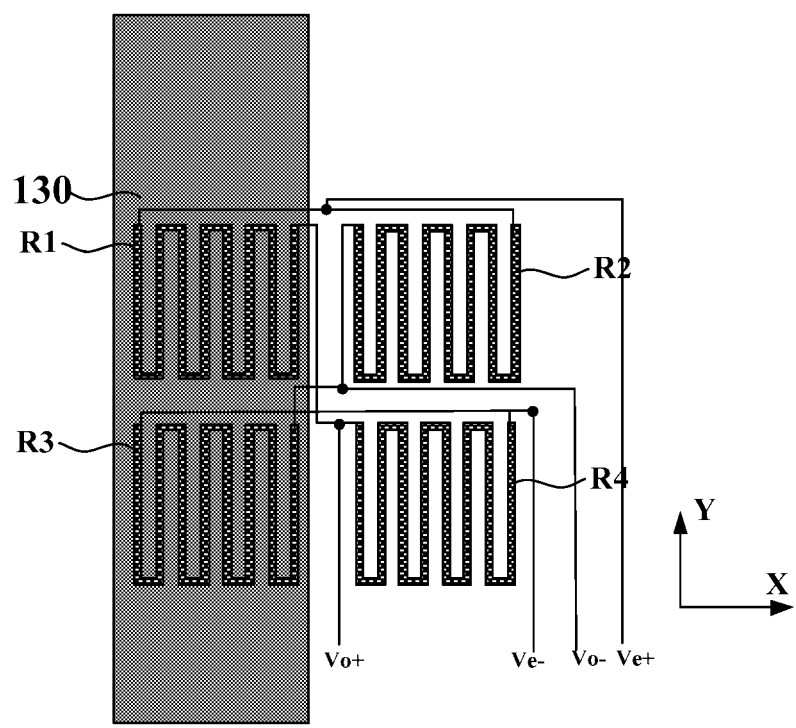

In one embodiment, on the basis of FIG. 5, referring to FIG. 7A, in the embodiment of the disclosure, the first resistor R1, the second resistor R2, the third resistor R3 and the fourth resistor R4 of the pressure sensor 140 all extend along the first direction X, and the extension direction of the sealant region covering the pressure sensor is vertical to the first direction X. The difference between FIG. 7B and FIG. 7A lies in that, the first resistor R1, the second resistor R2, the third resistor R3 and the fourth resistor R4 of the pressure sensor 140 all extend along the first direction Y, and the extension direction of the sealant region covering the pressure sensor is parallel to the first direction Y.

In the embodiment of the disclosure, the projection of the sealant 130 in the direction vertical to the display panel covers at least one resistor in the pressure sensor 140, and the projection of the sealant 130 in the direction vertical to the display panel covers at most three resistors in the pressure sensor 140. Thus, when the display panel is pressed, the resistance change of the resistor covered by the sealant 130 in the pressure sensor 140 is much less than the resistance change of the resistor uncovered by the sealant 130 in the pressure sensor 140, so that the resistance change difference between the four resistors in the pressure sensor 140 may be increased, facilitating the unbalance of the Wheatstone bridge structure, thereby improving the precision of pressure-sensitive detection of the display panel.

It may be understood by one skilled in the art that, the extension directions of the four resistors in the pressure sensor include, but are not limited to, those shown in FIG. 6A-FIG. 7B, and those skilled in the art may reasonably design the extension directions of the four resistors in the pressure sensor as may be necessary by the products, which will not be exemplified in the embodiments of the disclosure.

Figure 8:
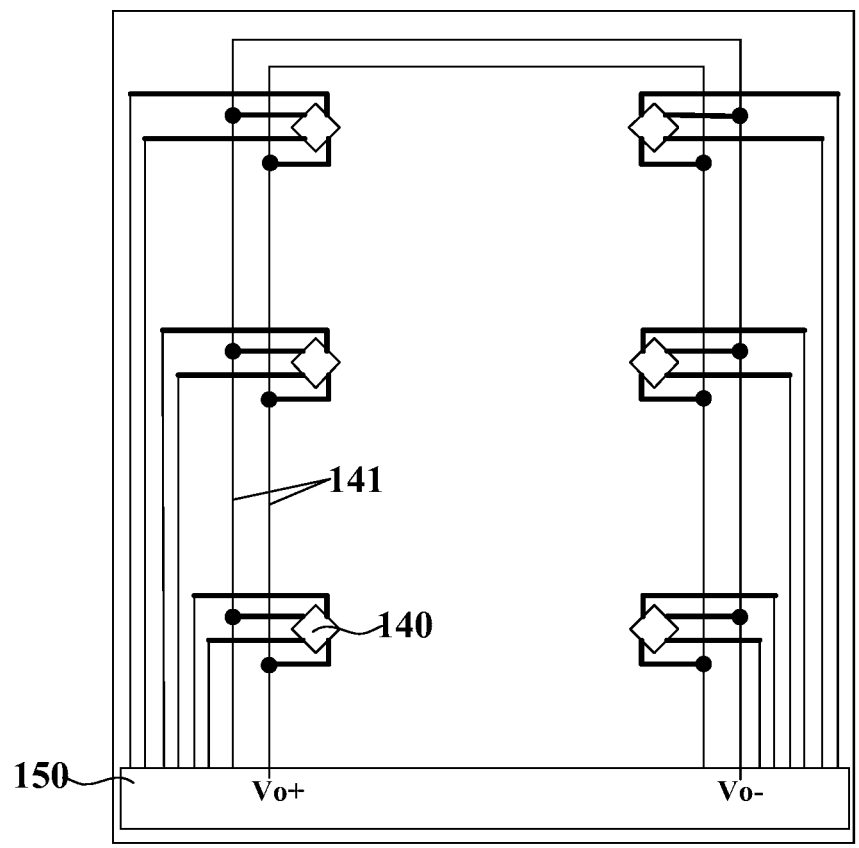
FIG. 8 is a schematic diagram of a display panel according to an embodiment of the disclosure.

In one embodiment, referring to FIG. 8, in an embodiment of the disclosure, a plurality of pressure sensors 140 share two power input lines 141. In the embodiment of the disclosure, the display panel includes a drive chip 150 which transfers the same pressure-sensitive drive signal to each of the pressure sensors 140 in the pressure-sensitive detection stage, so that the pressure sensor 140 in the display panel may share two power input lines 141, thereby effectively reducing the wiring of the pressure sensor 140 in the display panel, and realizing narrow frame.

Figure 9A:
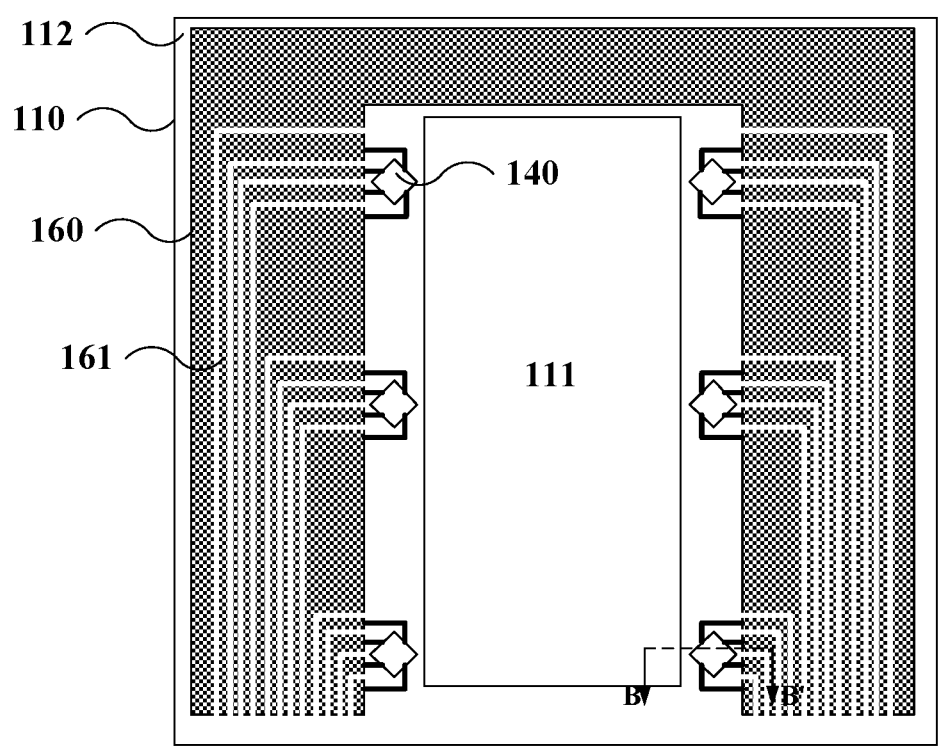
FIG. 9A is a schematic diagram of a display panel according to an embodiment of the disclosure.
Figure 9B:
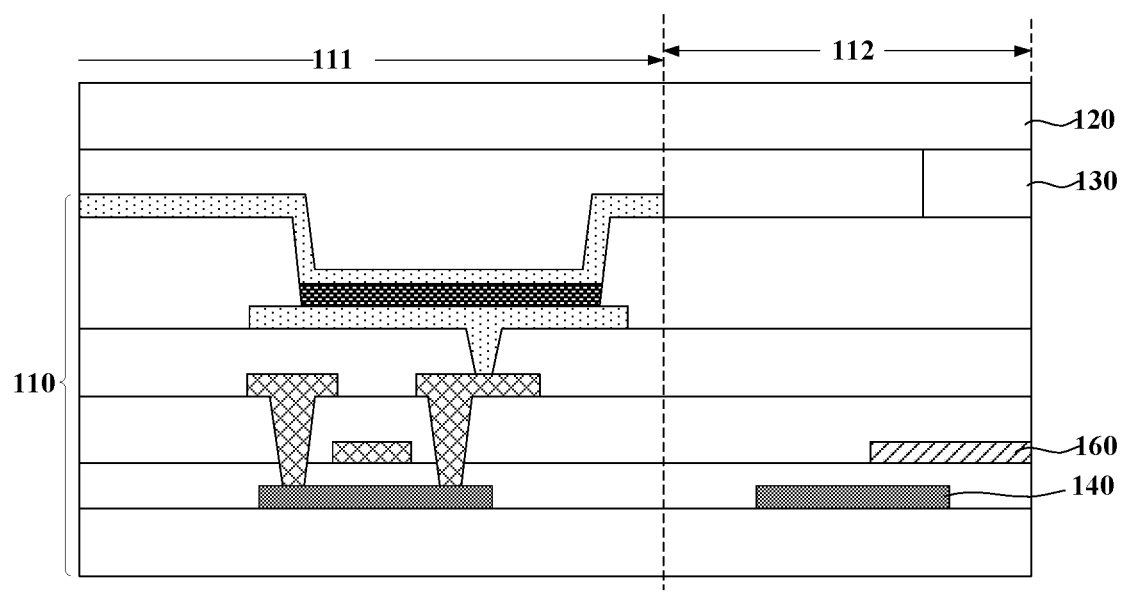
FIG. 9B is a sectional view of FIG. 9A along B-B'.

In one embodiment, referring to FIG. 9A-FIG. 9B, FIG. 9A is a schematic diagram of a display panel according to an embodiment of the disclosure, and FIG. 9B is a sectional view of FIG. 9A along B-B'. In the embodiment of the disclosure, the first substrate 110 includes a display region 111 and a non-display region 112 surrounding the display region 111; the first substrate 110 further includes an encapsulation metal ring 160 located in the non-display region 112 and surrounding the display region 111, the encapsulation metal ring 160 are partitioned into a plurality of first metal wirings 161, the plurality of first metal wirings 161 are electrically connected with a plurality of pressure sensors 140, and the plurality of first metal wirings 161 are multiplexed as the pressure-sensitive wirings of the plurality of pressure sensors 140; a sealant 130 which is located between the first substrate 110 and the second substrate 120, and the projection of the sealant 130 on the encapsulation metal ring 160 overlaps with the encapsulation metal ring 160.

As shown in FIG. 9B, the first substrate 110 is an organic light-emitting display array substrate, and the second substrate 120 is an encapsulation glass; in other embodiments, further the first substrate is an array substrate, and the second substrate is a color filter substrate. The sealant 130 is located between the first substrate 110 and the second substrate 120 and is configured to adheres the first substrate 110 to the second substrate 120. Specifically, the sealant 130 is melted by laser to adhere the first substrate 110 to the second substrate 120, wherein the laser is emitted from one side of the second substrate 120 facing away from the first substrate 110. Based on the arrangement that the projection of the sealant 130 on the encapsulation metal ring 160 overlaps with the encapsulation metal ring 160 and the encapsulation metal ring 160 has a light-tight feature, the encapsulation metal ring 160 can reflect a laser beam to focus the beam, so that the energy of the laser is superimposed to react the laser with the sealant 130 more sufficiently, and hence the sealant 130 can melt sufficiently, thereby improving the adhere effect between the first substrate 110 and the second substrate 120.

In the embodiment of the disclosure, based on the arrangement that the encapsulation metal ring 160 is located in the non-display region 112 of the first substrate 110 and surrounds the display region 111 and has a high conductivity, the encapsulation metal ring 160 optionally is partitioned to form a plurality of etched slots in the encapsulation metal ring 160, and hence a plurality of first metal wirings 161 are formed. The plurality of first metal wirings 161 are electrically connected to the plurality of pressure sensors 140 correspondingly. That is, the plurality of first metal wirings 161 may be multiplexed as the pressure-sensitive wiring of the pressure sensor 140.

Referring to FIG. 9A, six pressure sensors 140 are provided in the display panel, each pressure sensor 140 includes four pressure-sensitive wirings, twenty-four first metal wirings 161 are partitioned in the encapsulation metal ring 160 to be multiplexed as the six pressure-sensitive wirings of the pressure sensor 140, and the twenty-four first metal wirings 161 are provided corresponding to and electrically connected with the six pressure sensors 140 respectively.

Figure 10:
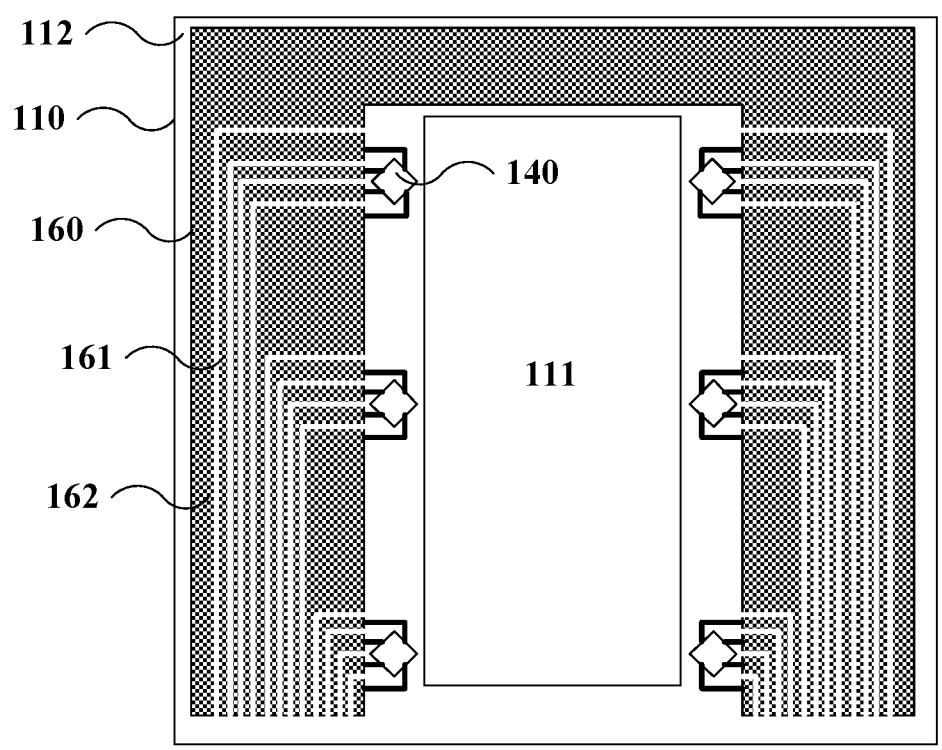
FIG. 10-FIG. 14 are schematic diagrams of a display panel according to an embodiment of the disclosure.

In one embodiment, on the basis of FIG. 9A-FIG. 9B, referring to FIG. 10, in the embodiment of the disclosure, a second metal wiring 162 surrounding the display region 111 is further partitioned in the encapsulation metal ring 160, the second metal wiring 162 is located on the outmost of the plurality of first metal wirings 161 and surrounds the plurality of first metal wirings 161, and the second metal wiring 162 is multiplexed as a ground wire of the display panel. In the embodiment of the disclosure, the static electricity can be led out of the first substrate 110 via the second metal wiring 162, thereby preventing static electricity.

Figure 11:
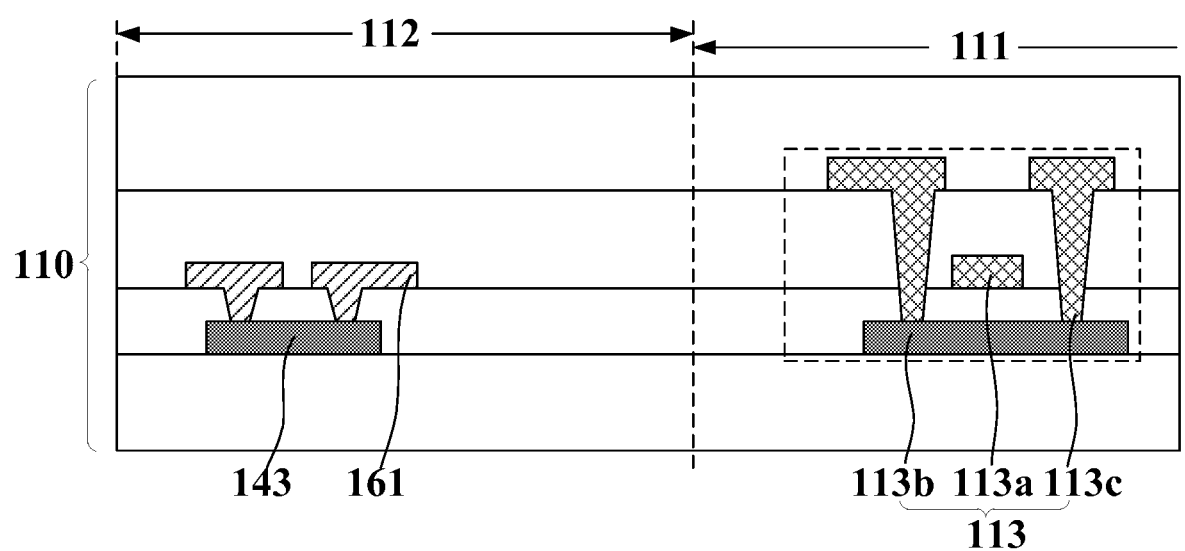

In one embodiment, on the basis of FIG. 9A-FIG. 9B, referring to FIG. 11, in an embodiment of the disclosure, the first substrate 110 includes a plurality of thin-film transistors 113, and the thin-film transistor 113 includes a first gate electrode 113a, a first active layer 113b and a first drain electrode 113c. In one embodiment, the pressure sensor 140 is a semiconductor pressure sensor, and any resistor in the semiconductor pressure sensor is made of a semiconductor material film 143; and the first active layer 113b and the semiconductor material film 143 are provided on the same layer.

In the embodiment of the disclosure, the semiconductor material film 141 and the first active layer 113b are made of the same compositional material and formed on the same layer via one mask. Thus, the thin-film transistor 113 and the pressure sensor 140 are realized in the display panel without increasing the processes or the cost. It needs to be noted that, in other embodiments, the compositional material of the first active layer of thin-film transistor may further optionally be a semiconductor oxide such as zinc oxide, indium oxide and tin oxide, etc., or it may optionally be an alloy of zinc oxide, indium oxide and tin oxide, etc. In one embodiment, the semiconductor material film of the pressure sensor is provided on the same layer as the first active layer of thin-film transistor.

Figure 12:
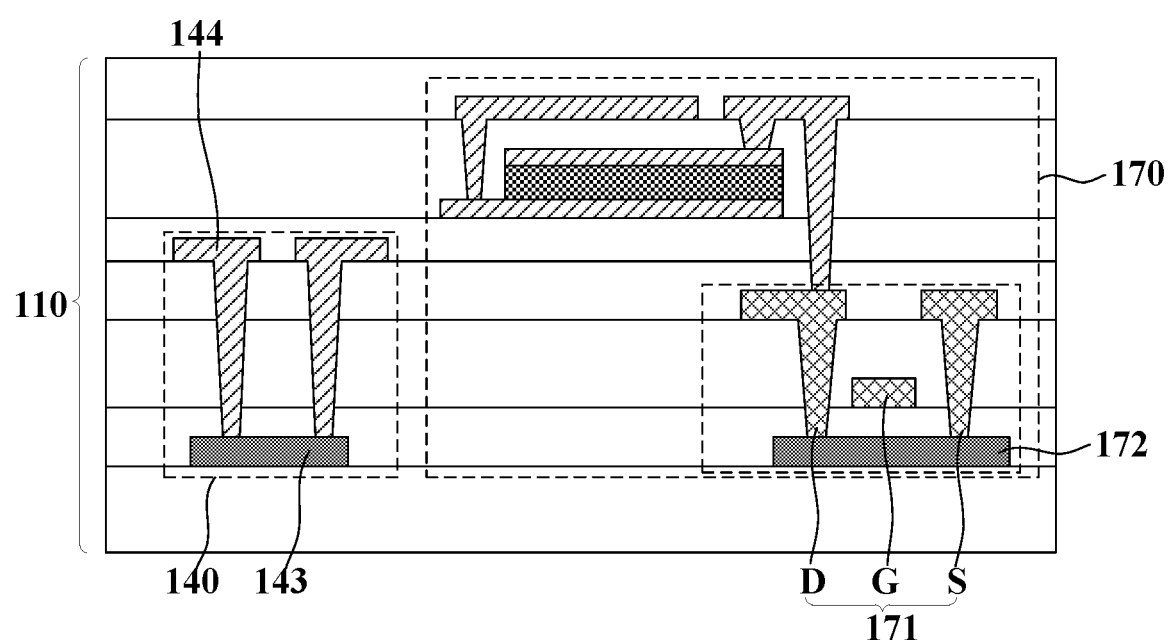

In one embodiment, referring to FIG. 12, in an embodiment of the disclosure, the first substrate 110 includes a plurality of pressure sensors 140 and a plurality of light-sensitive identification structures 170 arranged in an array, any of the four resistors of the pressure sensor 140 is made of a semiconductor material film 143, and the light-sensitive identification structure 170 includes a light-sensitive identification switch 171, wherein the light-sensitive identification switch 171 includes a first active layer 172, wherein, the semiconductor material film 143 is provided on the same layer as the first active layer 172. It may be understood by one skilled in the art that, the specific structures and working processes of the pressure sensor and the light-sensitive identification structure are similar to those of the prior art, and thus no repeated description will be given herein.

In the embodiment of the disclosure, any resistor in the pressure sensor 140 employs a semiconductor material film 143, and the semiconductor material film 143 is provided on the same layer as the first active layer 172. In one embodiment, the semiconductor material film 143 and the first active layer 172 are made of the same compositional material and formed on the same layer via one mask. Thus, the pressure sensor 140 and the light-sensitive identification structure 170 are formed simultaneously in the display panel without increasing the processes or the cost.

It needs to be noted that, the pressure-sensitive wiring 144 of the pressure sensor 140 may multiplex any metal film in the first substrate 110, and it will not be described again here.

Figure 13:
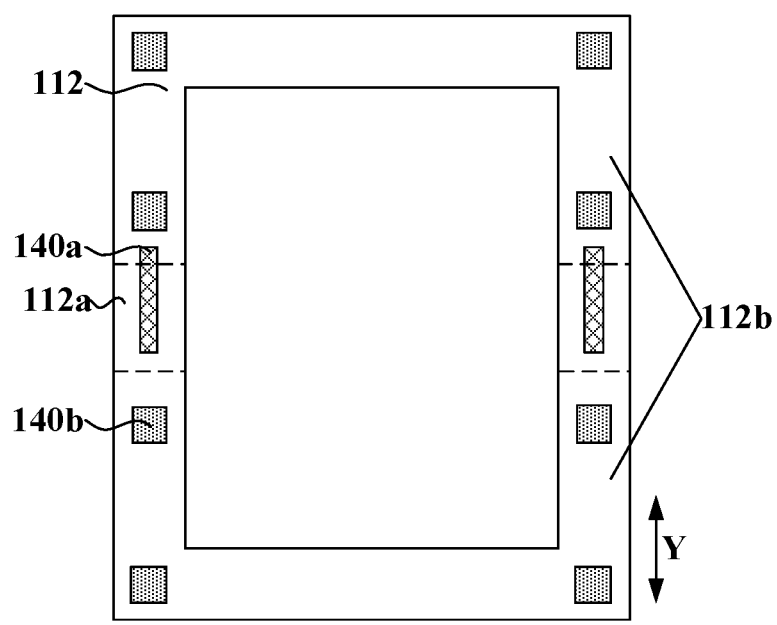

In one embodiment, referring to FIG. 13, a display panel according to an embodiment of the disclosure is a flexible organic light-emitting display panel, wherein, the non-display region 112 includes a flexible region 112a and a nonflexible region 112b, and a metal bridge-type pressure sensor 140a is at least partially provided on the flexible region 112a and extends along the bending direction Y of the flexible organic light-emitting display panel, and a plurality of semiconductor pressure sensors 140b are at least provided in the nonflexible region 112b.

In the embodiment of the disclosure, the flexible organic light-emitting display panel may be bent in the flexible region 112a and have a big bending degree. The metal bridge-type pressure sensor 140a at least partially provided in the flexible region 112a has the excellent bending tolerance so that it can meet the bending requirement of the flexible organic light-emitting display panel. Moreover, the bending state and the bending degree of the flexible region 112a of the flexible organic light-emitting display panel can be effectively detected, which is favorable for improving the reliability of the product.

In the embodiment of the disclosure, the semiconductor pressure sensor 140b has an advantage of high sensitivity and the strong pressure sensing ability, and also the semiconductor pressure sensor 140b provided in the nonflexible region 112b can effectively detect whether the flexible organic light-emitting display panel is pressed and also detect the press degree thereof, which is favorable for improving the induction sensitivity of the product.

Figure 14:
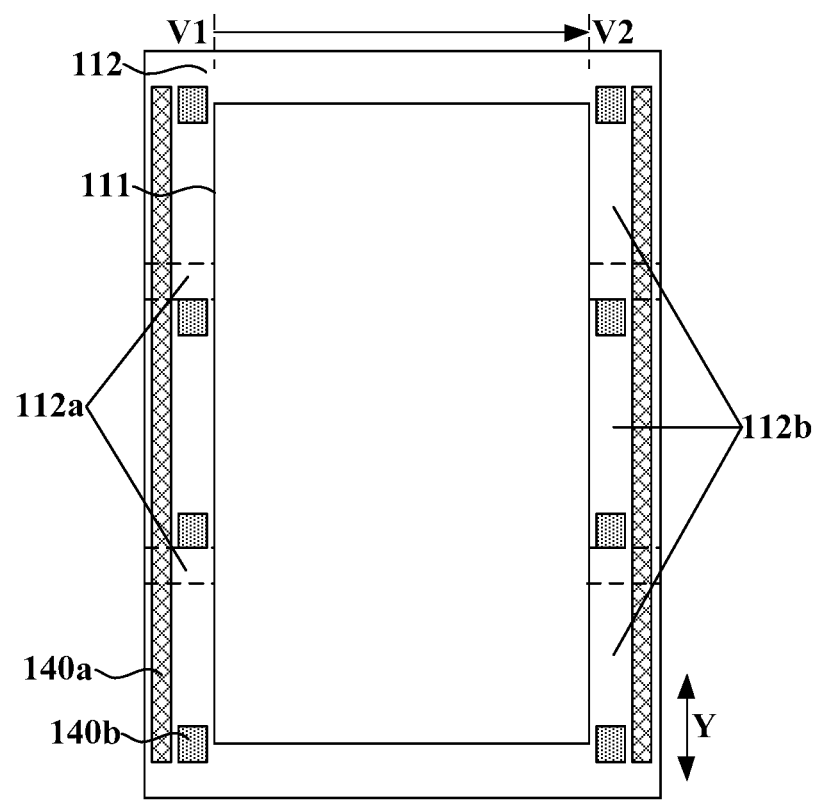

In one embodiment, referring to FIG. 14, in an embodiment of the disclosure, a flexible organic light-emitting display region of the display panel 111 has a first side V1 and a second side V2. The direction of the first side V1 of the display region 111 pointing to the second side V2 is vertical to the bending direction Y of the flexible organic light-emitting display panel; the non-display region 112 includes a plurality of flexible regions 112a and a plurality of nonflexible regions 112b provided alternately; the plurality of semiconductor pressure sensors 140b are at least provided in the non-display region 112 on the first side V1 of the display region 111 and the non-display region 112 on the second side V2 of the display region 111; and at least one metal bridge-type pressure sensor 140a extends and penetrates through the plurality of flexible regions 112a and the plurality of nonflexible regions 112b.

Figure 15:
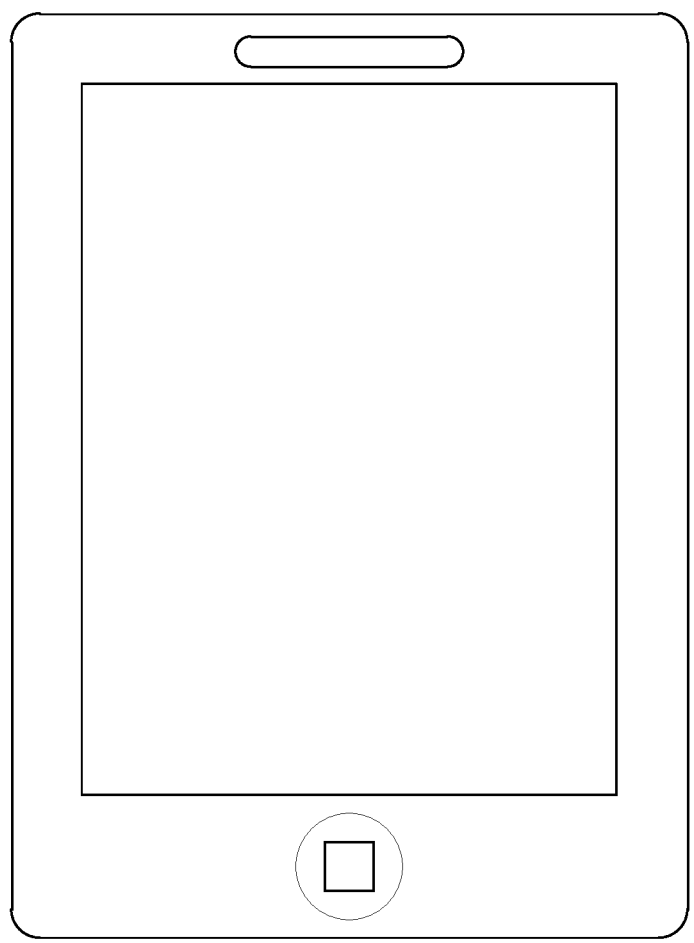
FIG. 15 is a schematic diagram of an electronic device according to an embodiment of the disclosure.

An embodiment of the disclosure further provides an electronic device, which includes any of the above display panels. The electronic device may be any display device equipped with a pressure sensor, for example, an intelligent mobile phone, a tablet computer, etc., which is not specifically defined in the disclosure. Referring to FIG. 15, the electronic device may optionally be an intelligent mobile phone.

In the electronic device according to the embodiment of the disclosure, the vertical projection of the sealant in the display panel covers at least one resistor in the pressure sensor, so that the precision of pressure-sensitive detection can be improved while realizing narrow frame.

It needs to be noted that, each of the above drawings only shows a partial structure or a local structure of the display panel, rather than the whole structure of the display panel. It may be understood by one skilled in the art that, in the above embodiments, the array substrate is provided with drive elements that drive a pixel unit. Specifically, the array substrate may be provided with a plurality of scanning lines and a plurality of data lines, adjacent two scanning lines and two data lines are intersected and form a pixel unit, and each of the pixel units is provided with a thin-film transistor and a pixel electrode. The gate electrode of the thin-film transistor is electrically connected with a scanning line correspondingly, the source electrode of the thin-film transistor is electrically connected with a data line correspondingly, and the drain electrode of the thin-film transistor is connected to the pixel electrode. For other structure or the whole structure of the display panel, reference may be made to an existing display panel, and it will not be described again here.

It should be noted that the embodiments of the present invention and the technical principles used therein are described as above. It should be appreciated that the invention is not limited to the particular embodiments described herein, and any apparent alterations, modification and substitutions can be made without departing from the scope of protection of the invention. Accordingly, while the invention is described in detail through the above embodiments, the invention is not limited to the above embodiments and can further include other additional embodiments without departing from the concept of the invention.

What is claimed is:

1. A display panel, comprising:
a first substrate and a second substrate provided opposite to each other, which are adhered to each other via a sealant, wherein the sealant surrounds a display region of the display panel; and
a plurality of pressure sensors, which are provided on one side of the first substrate facing the second substrate, wherein, the pressure sensor comprises four resistors, and the sealant is vertically projected on the display panel, and the projection of the sealant on the display panel covers at least one resistor of the plurality of resistors in the pressure sensor and exposes at least one other resistor of the plurality of resistors,
wherein the sealant is configured to cause a difference between deformation of the at least one resistor covered by the projection of the sealant and deformation of the at least one resistor exposed;
wherein under pressure, the deformation of the at least one resistor covered by the projection of the sealant is less than the deformation of the at least one resistor exposed, and a resistance change of the at least one resistor covered by the projection of the sealant is less than a resistance change of the at least one resistor exposed.

2. The display panel as claimed in claim 1, wherein the pressure sensor comprises: a first resistor, a second resistor, a third resistor and a fourth resistor electrically connected successively end to end, an electrical connection point of the first resistor and the fourth resistor functions as a first power input terminal, an electrical connection point of the second resistor and the third resistor functions as a second power input terminal, an electrical connection point of the first resistor and the second resistor functions as a first induction signal-measuring terminal, and an electrical connection point of the third resistor and the fourth resistor functions as a second induction signal-measuring terminal.

3. The display panel as claimed in claim 2, wherein the projection of the sealant in the direction vertical to the display panel covers the first resistor and the third resistor in the pressure sensor.

4. The display panel as claimed in claim 2, wherein the projection of the sealant in the direction vertical to the display panel covers the second resistor and the fourth resistor in the pressure sensor.

5. The display panel as claimed in claim 1, wherein any of the plurality of resistors in the pressure sensor is a semiconductor material film.

6. The display panel as claimed in claim 2, wherein any of the plurality of resistors in the pressure sensor is a serpentine metal film wiring.

7. The display panel as claimed in claim 6, wherein the first resistor and the third resistor extend along a first direction, the second resistor and the fourth resistor extend along a second direction, wherein, the first direction and the second direction are intersected with each other vertically, and an extension direction of the sealant region for covering the pressure sensor is parallel to the first direction.

8. The display panel as claimed in claim 6, wherein the first resistor and the third resistor extend along a first direction, the second resistor and the fourth resistor extend along a second direction, wherein, the first direction and the second direction are intersected with each other vertically, and an extension direction of the sealant region for covering the pressure sensor is vertical to the first direction.

9. The display panel as claimed in claim 6, wherein the first resistor, the second resistor, the third resistor and the fourth resistor all extend along a first direction, and an extension direction of the sealant region for covering the pressure sensor is parallel to the first direction.

10. The display panel as claimed in claim 6, wherein the first resistor, the second resistor, the third resistor and the fourth resistor all extend along a first direction, and an extension direction of the sealant region for covering the pressure sensor is vertical to the first direction.

11. The display panel as claimed in claim 1, wherein the plurality of pressure sensors share two power input lines.

12. The display panel as claimed in claim 1, wherein the first substrate is an array substrate, and the second substrate is a color filter substrate.

13. The display panel as claimed in claim 1, wherein the first substrate is an organic light-emitting display array substrate, and the second substrate is an encapsulation glass.

14. The display panel as claimed in claim 1, wherein the first substrate is a color filter substrate, the second substrate is an array substrate.

15. The display panel as claimed in claim 1, wherein the first substrate is an encapsulation glass, the second substrate is an organic light-emitting display array substrate.

16. A touch display device, comprising a display panel which comprises:
   a first substrate and a second substrate provided opposite to each other, which are adhered to each other via a sealant, wherein the sealant surrounds a display region of the display panel; and
   a plurality of pressure sensors, which are provided on one side of the first substrate facing the second substrate, wherein, the pressure sensor comprises four resistors, and the sealant is vertically projected on the display panel, and the projection of the sealant on the display panel covers at least one resistor of the plurality of resistors in the pressure sensor and exposes at least one other resistor of the plurality of resistors,
   wherein the sealant is configured to cause a difference between deformation of the at least one resistor covered by the projection of the sealant and deformation of the at least one resistor exposed;
   wherein under pressure, the deformation of the at least one resistor covered by the projection of the sealant is less than the deformation of the at least one resistor exposed, and a resistance change of the at least one resistor covered by the projection of the sealant is less than a resistance change of the at least one resistor exposed.

* * * * *